United States Patent [19]
Yamazaki

[11] Patent Number: 5,523,248
[45] Date of Patent: Jun. 4, 1996

[54] METHOD FOR MANUFACTURING MOS TRANSISTORS WITH HIGH BREAKDOWN VOLTAGE

[75] Inventor: Takeshi Yamazaki, Kanagawa, Japan

[73] Assignee: Sony Corporation, Tokyo, Japan

[21] Appl. No.: 447,008

[22] Filed: May 22, 1995

[30] Foreign Application Priority Data

May 24, 1994 [JP] Japan .................................. 6-135162

[51] Int. Cl.⁶ .............................................. H01L 21/265
[52] U.S. Cl. .................. 437/40; 437/41; 437/56; 437/59
[58] Field of Search ................................ 437/40 R, 41 R, 437/69, 70, 56, 59

[56] References Cited

U.S. PATENT DOCUMENTS

| | | | |
|---|---|---|---|
| 5,004,701 | 4/1991 | Motokawa | 437/70 |
| 5,073,510 | 12/1991 | Kwon et al. | 437/40 R |
| 5,173,438 | 12/1992 | Sandhu | 437/69 |
| 5,223,451 | 6/1993 | Uemura et al. | 437/40 R |
| 5,254,495 | 10/1993 | Lur et al. | 437/69 |
| 5,268,585 | 12/1993 | Yamauchi | 437/40 R |
| 5,358,890 | 10/1994 | Sivan et al. | 437/69 |
| 5,372,951 | 12/1994 | Anjum et al. | 437/70 |

*Primary Examiner*—Tom Thomas
*Assistant Examiner*—Kevin M. Picardat
*Attorney, Agent, or Firm*—Hill, Steadman & Simpson

[57] ABSTRACT

A semiconductor device in which low voltage elements and high voltage elements are formed on the same substrate. To simplify the manufacturing process of semiconductor devices and to improve the punch through voltage resistance between elements, when high voltage elements and low voltage elements are formed on the same semiconductor substrate, during the process for injecting p-type impurity into semiconductor substrate in the low voltage sections, at first a mask pattern having openings above the low voltage sections and openings above the element separating areas of the high voltage sections is formed, then p-type impurity is injected into the semiconductor substrate from above the mask pattern, followed by heat-treatment of the semiconductor substrate to diffuse p-type impurity into the semiconductor substrate. Thereby, channel stop diffusion layers comprising p-type impurity layer are formed under the element separating areas formed in the high voltage sections.

8 Claims, 4 Drawing Sheets

F I G. 2A
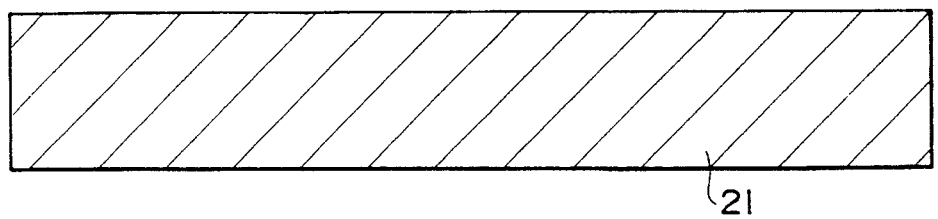
F I G. 2B
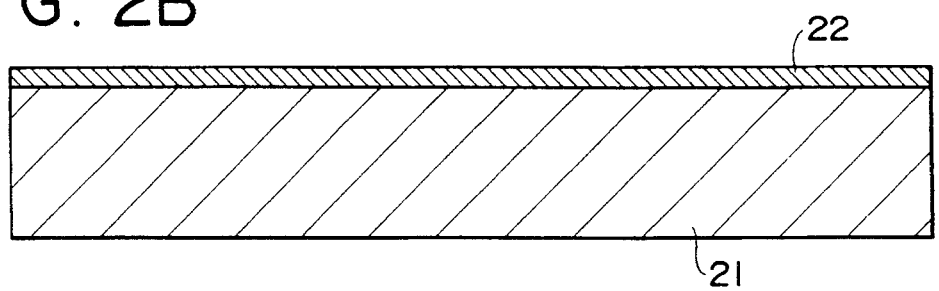
F I G. 2C
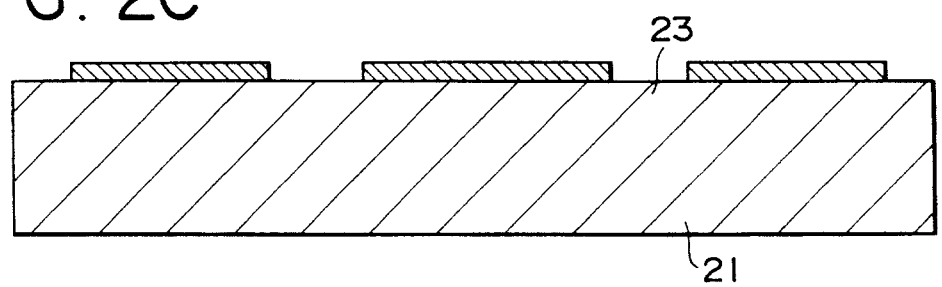
F I G. 2D
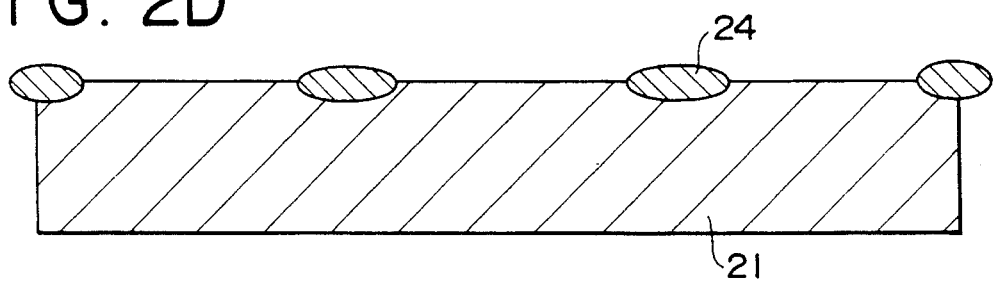
F I G. 2E
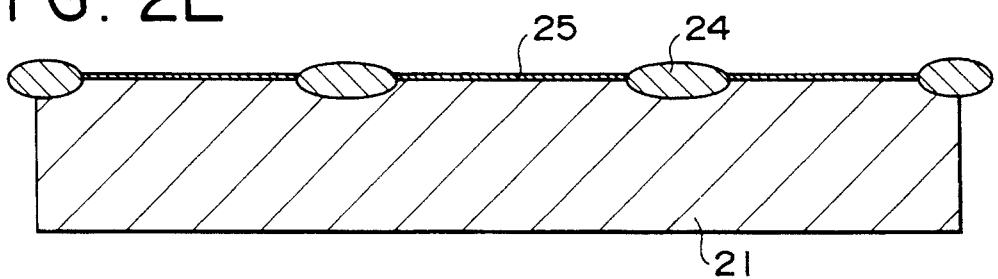

F I G. 2F
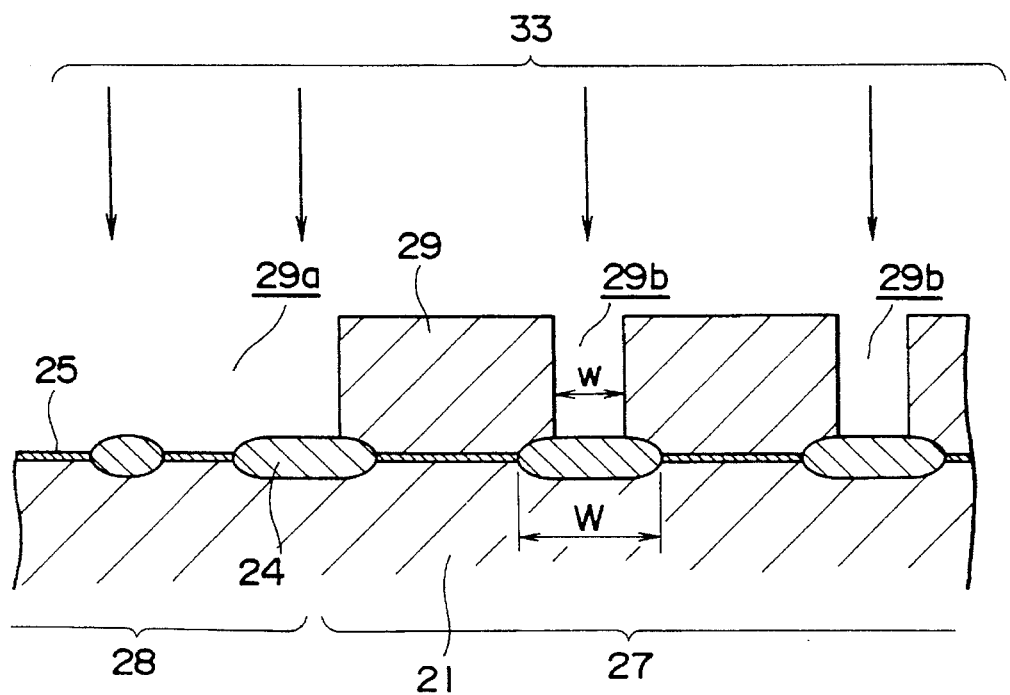
F I G. 2G
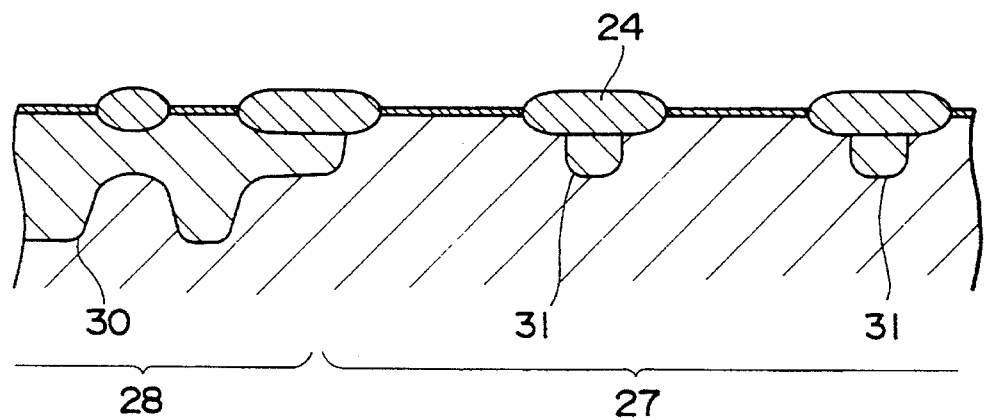

METHOD FOR MANUFACTURING MOS TRANSISTORS WITH HIGH BREAKDOWN VOLTAGE

BACKGROUND OF THE INVENTION

1. Field of the Invention

This invention relates to a method for forming channel stop diffusion layers, and more particularly to a method for forming channel stop diffusion layers formed on element separating areas in the manufacturing process of semiconductor devices.

2. Description of Related Art

As the semiconductor device has been densely integrated progressively, the element structure has been minimized. On the other hand, the on-chip system, which involves the combination of minimized semiconductor elements and systems for operating the semiconductor elements built on one chip, has been popular. In the case of on-chip semiconductor devices, low voltage elements with low voltage and high voltage elements with high voltage are formed on the same semiconductor substrate to accomplish minimization.

In a semiconductor device as described hereinabove, for example, the low voltage elements are separated individually by element separating films, and high voltage elements and channel stop diffusion layers formed under the element separating films are separated individually by the element separating films.

The channel stop diffusion layers are formed as described herein under.

At first, on a semiconductor substrate on which the element separating films are formed, a mask pattern comprising resist is formed. The mask pattern is a mask pattern for forming channel stop diffusion layers, openings are provided above the element separating films only in the high voltage sections.

Then, impurity is injected into the semiconductor substrate from above the mask pattern. Subsequently, the semiconductor substrate is heat-treated to diffuse the impurity into the semiconductor substrate, and channel stop diffusion layers are formed in the semiconductor substrate under the element separating films of the high voltage sections.

Channel stop diffusion layers may be formed before element separating films are formed on the surface of a semiconductor substrate.

The above mentioned channel stop forming method is involved in some problems as described herein under.

When impurity for channel stop is injected into a semiconductor substrate, a mask pattern for only the channel stop is formed on the semiconductor substrate, and impurity is injected from above the mask pattern. Consequently, the formation of channel stop diffusion layers requires complex processes comprising a process for forming the mask pattern, a process for injecting impurity into a semiconductor substrate, and a process for removing the mask pattern in addition to the regular manufacturing process.

This requirement is one of factors which make the manufacturing process complex for forming the semiconductor device.

OBJECTS AND SUMMARY OF THE INVENTION

It is the first object of the present invention to provide a method for forming channel stop diffusion layers which solve the problems described above.

It is the second object of the present invention to provide a method for eliminating a process for forming separating areas of MOS IC having high voltage MOS transistors.

The present invention which is developed to attain the objects described above comprises a method in which channel stop diffusion layers are formed between individual high voltage elements when high voltage elements and low voltage elements are formed on the same semiconductor substrate, and the method of the invention is carried out as described hereinafter.

During the process in which the same impurity of the first conducting type as used for forming channel stop diffusion layers in high voltage sections is injected into a semiconductor substrate of the low voltage sections, at first a mask pattern having openings above the low voltage sections and above the element separating areas in the high voltage sections is formed on the semiconductor substrate. Then, the above mentioned impurity of the first conducting type is injected into the semiconductor substrate above the mask pattern. Subsequently, the impurity of the first conducting type is diffused into the semiconductor substrate.

The opening width of the openings above the element separating region formed on the mask pattern may be designed narrower than the element separating width of the element separating region and both ends of the openings may be provided inside both the ends of the element separating region.

According to the method for forming the channel stop diffusion layers, openings which are open above the element separating areas in the high voltage sections are provided on the mask pattern which is used when the impurity of the first conducting type is injected to the low voltage sections. The impurity of the first conducting type is injected above the mask pattern. Therefore, during the process for forming impurity layer of the first conducting type in the semiconductor substrate of the low voltage sections, channel stop diffusion layers for separating individually high voltage elements are formed simultaneously.

BRIEF DESCRIPTION OF THE DRAWINGS

FIGS. 2A to 2G are sectional process step views for illustrating the process steps for MOS IC having high voltage element sections of the second embodiment of the present invention.

DETAILED DESCRIPTION OF THE PREFERRED EMBODIMENTS

Figure 1:
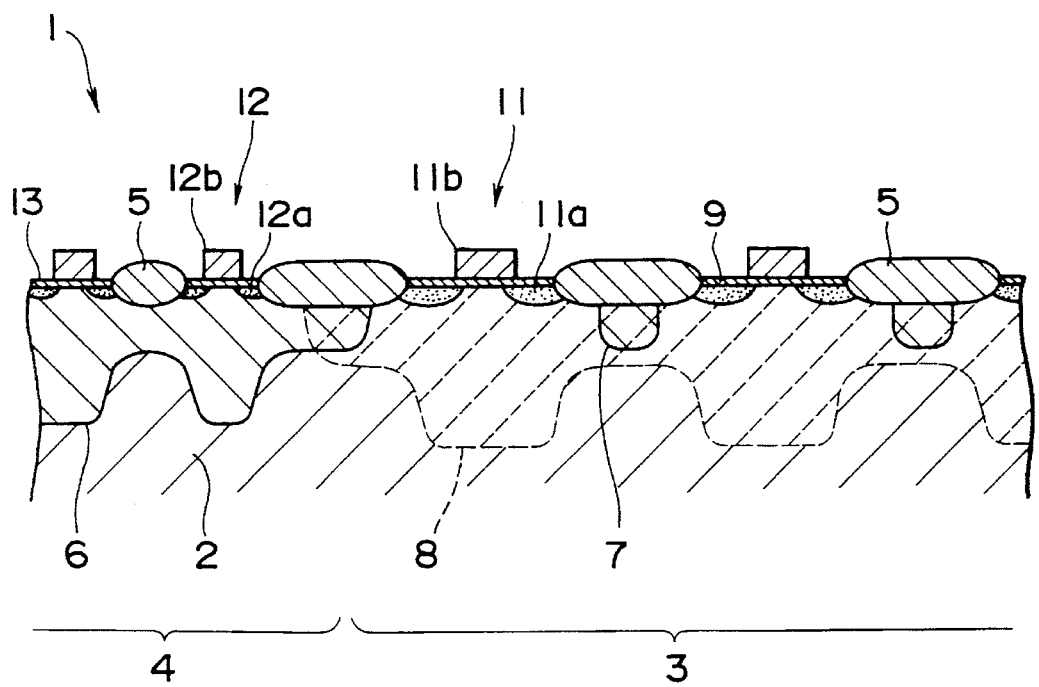
FIG. 1 is a sectional structure of MOS IC for illustrating the first embodiment of the present invention.

Embodiments for forming channel stop diffusion layers of the present invention are described referring to the drawings.

At first, the structure of MOS IC formed in accordance with the present invention, that is the first embodiment of the present invention, is described. The channel stop diffusion layers are formed on a semiconductor device illustrated in FIG. 1.

The high voltage sections 3 and low voltage sections 4 are formed on a semiconductor substrate 2. On the high voltage sections 3, a plurality of high voltage elements 11 which withstand high voltage are provided. On the other hand, in the low voltage sections 4, a plurality of low voltage elements 12 which have lower withstand voltage comparing with the high voltage elements 11 are provided.

The high voltage elements 11 and low voltage elements 12 are MOS transistors having source and drain, which transistors are formed with, for example, impurity layers 6 and 8 of the first conducting type are formed in the top layer of a semiconductor substrate 2, and in the impurity layers 6 and 8 the sources and drains comprising impurity layers 11a and 12a of the second conducting type are formed. Here for example, the high voltage elements 11 and low voltage elements 12 are n channel transistors and the first conducting type is p-type, and the second conducting type is n-type.

On the surface of the semiconductor substrate 2 comprising the high voltage sections 3 and low voltage sections 4, element separating areas 5 are formed for separating each element individually.

When the semiconductor device 2 with a structure described above is formed, channel stop diffusion layers 7 for separating the high voltage elements 11 individually are formed under the element separating areas 5 in the high voltage sections.

In the following, a method for forming channel stop diffusion layers in accordance with the second embodiment of the present invention and a method for manufacturing MOS IC using channel stop diffusion layers are described referring to FIGS. 2A to 2H.

FIG. 2A is a silicon substrate 21.

On the portions to be converted to transistors on the substrate, oxidation resistant SiN layer 22 is formed by CVD process.

Then, SiN is partially removed by etching at positions corresponding to element separating areas 23 as shown in FIG. 2C.

Subsequently, LOCOS oxide films 24 with thickness of 400 to 500 nm are formed on the position of element separating areas by, for example, thermal oxidation, and followed by removal of SiN as shown in FIG. 2D.

In the next, sacrifice oxide films 25 with thickness of 40 nm are formed partially on the surface of element forming sites as shown in FIG. 2E.

FIG. 2F is described.

Resist is applied covering element separating areas 24 and sacrifice oxide films 25, and a mask pattern 29 is formed by patterning the resist. The mask pattern 29 has openings 29a which open entirely above the low voltage sections 28 and has openings 29b which open above each element separating area 24 in the high voltage sections 27.

The opening width of the openings 29b formed above the element separating areas 24 in the high voltage sections 27 is formed narrower than element separating width of the element separating areas 24. That is, an opening 29b is formed so as that resist of the mask pattern 29 covers above the periphery of the element separating areas 24, and so as that the periphery of an opening 29b is positioned inside the periphery of an element separating area 24.

Herein for example, an opening 29b is positioned on an element separating area 24 in the high voltage sections so as that the center of an opening 29b and an element separating area 24 coincide. In the case of the element separating width W =8 μm, the opening width w =5 μm so as that the peripheral width of 1.5 μm of an element separating area is covered with resist.

p-type impurity, for example boron ions, are injected from above the mask pattern 29.

Herein for example, p-type impurity 33 is injected stepwise as described herein under.

In the first step, p-type impurity is injected with injection energy of 300 to 500 keV to dose of $1.0E13/cm^2$ to form p-well in the p-type diffusion layers 30.

Then, in the second step, p-type impurity 33 is injected with injection energy of 100 to 150 key to dose of 1.0E12 to $13/cm^2$ to form punch through prevention layers in the p-type diffusion layers 30.

Further in the third step, p-type impurity is injected with injection energy of 20 key to a dose of 1.0E11 to $12/cm^2$ to make the upper layer of the p-type diffusion layers 30 threshold voltage adjusting layers. The injection energy of the first step and the second step is required for the p-type impurity 33 to penetrate into the semiconductor substrate 21 through element separating areas 24.

As described above, p-type impurity 33 is injected into the semiconductor substrate 21 followed by removal of the mask pattern 29 as shown in FIG. 2G.

The semiconductor substrate 21 is heat-treated, and the p-type impurity (33) injected in the processes described above is diffused in the semiconductor substrate 21. Thereby, the p-type impurity layers 30 are formed in the semiconductor substrate 21 in the low voltage sections 28. Channel stop diffusion layers 31 where the p-type impurity (33) diffused are formed under the element separating areas in the semiconductor substrate 21 within the high voltage sections 27.

In the method for forming the channel stop diffusion layers, the openings 29b are provided to exposure above the element separating areas 24 in the high voltage sections 27 on the mask pattern 29 used in the process for injection of p-type impurity in the low voltage sections 28. The p-type impurity 33 is injected from above the mask pattern 29.

Therefore, channel stop diffusion layers 31 are formed in the high voltage sections 27 simultaneously in the process for forming p-type impurity layer in the semiconductor substrate 21 of the low voltage sections 28.

Because the opening width w of the opening 29b and the position are designed as described above, no channel stop 31 is formed under the periphery of element separating areas 24. Thereby, a gap is provided between a high voltage element 11, which is located in an area separated by the element separating areas 24, and a nearby channel stop diffusion layer 31.

Figure 2H:
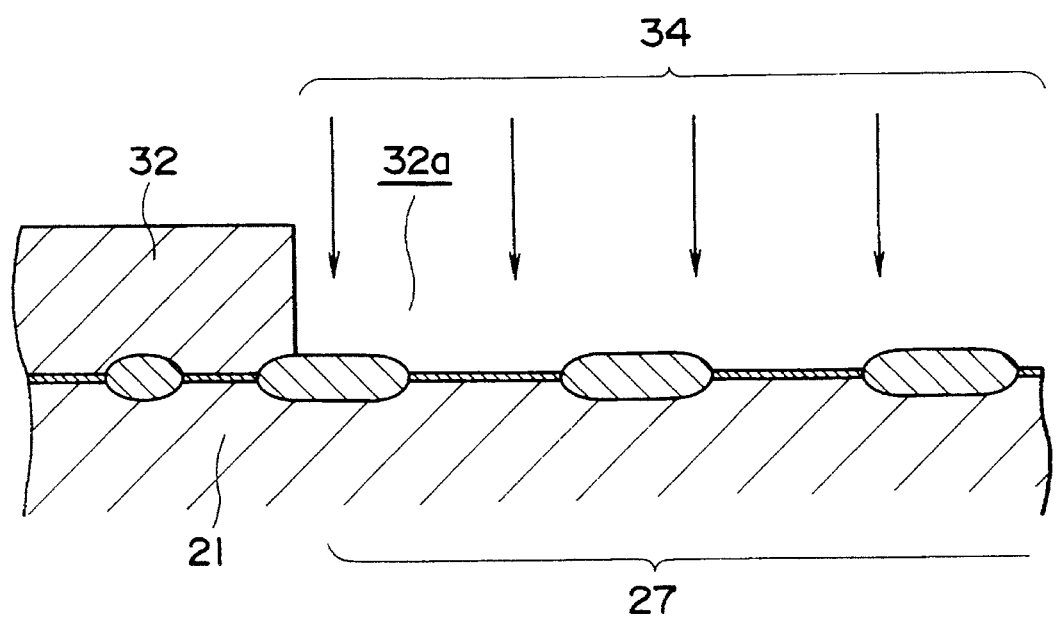
FIG. 2H is a sectional process for forming the semiconductor device shown in FIG. 1.

In the case of forming a semiconductor device 3 shown in FIG. 1, for example, a process, shown in FIG. 2H, is inserted between the impurity injection process described in FIG. 2F and the thermal diffusion process described in FIG. 2G.

In this case, at first the mask pattern 29 on the semiconductor substrate 21 is removed.

In the next, resist is coated on element separating areas 24 and sacrifice oxide films 25, and the resist is patterned to form a mask pattern 32 of the resist. The mask pattern 32 has, for example, openings 32a for exposing the entire high voltage sections 27.

The p-type impurity such as boron ions are injected from above the mask pattern 32. The injection of boron ions is operated step-wise in the same manner as used in the process described hereinbefore.

After the process, the mask pattern 32 is removed. The process described in FIG. 2H may be preceded before the process described in FIG. 2F.

After the injection of the p-type impurity 33 into the semiconductor substrate 21 as described hereinbefore, the semiconductor substrate 21 is subjected to heat-treatment.

Process following after the heat-treatment is described referring to FIG. 1.

p-type impurity layers 6 are formed in the low voltage sections 4, channel stop diffusion layers 7 and p-type impurity layers 8 are formed in the semiconductor substrate 2 of the high voltage sections 3.

After forming the impurity layers 6, 7, and 8, the process for forming elements on the high voltage sections 3 and low voltage sections 4 is operated.

The sacrifice oxide films are removed by etching to exposure the surface of the semiconductor substrate 2. On the surface of the semiconductor substrate 2, gate oxide films 9 are formed.

On the surface of the gate oxide films 9 and element separating areas 5, gate electrode forming layers (not shown) consisting of polysilicon are formed. The gate electrode forming layers are patterned to form gate electrodes 11b and 12b.

Impurity of the second conducting type (referred as n-type hereinafter) is injected into the semiconductor substrate 2 of the high voltage sections 3 and low voltage sections 4 from above the gate electrodes 11b and 12b. The impurity is diffused by heat-treatment to form source/drain of n-type impurity layers 11a and 12a in the semiconductor substrate 2. Thereby, the semiconductor device 1 comprising high voltage elements 11 and low voltage elements 12 formed on the same semiconductor substrate 2 is formed.

In the semiconductor device 1, a high voltage element 11 and adjacent high voltage element 11 are separated by an element separating area 5 and a channel stop diffusion layer 7 formed under the high voltage element 11. On the other hand, a low voltage element 12 and adjacent low voltage element 12 are separated by an element separating area 5.

A space is provided between a channel stop diffusion layer 7 and nearby high voltage element 11, consequently break down between n-type impurity layer 11a of the high voltage element 11 and a channel stop diffusion layer 7 is prevented.

In the embodiments described hereinbefore, the case that p-type is the first conducting type and n-type is the second conducting type is described, but the combination may be changed to the reversed case that n-type is the first conducting type and p-type is the second conducting type.

In the embodiments, the element separating area 5 is LOCOS oxide film, but the embodiments can be applied to trench element separating.

The high voltage element and low voltage element are by no means limited to MOS type transistor as described hereinbefore, the present invention is applied to the structure having parasitic MOS transistors on element separating areas.

As described hereinbefore, according to the method for forming channel stop diffusion layer of the present invention, impurity layer in low voltage sections and channel stop diffusion layer in high voltage sections can be formed in the same process by forming a mask pattern having openings above the low voltage sections and above element separating areas in the high voltage sections. In the manufacturing process of the semiconductor device in which high voltage elements and low voltage elements are provided on the same semiconductor substrate, processes needed for only channel stop diffusion layers including a process for forming a mask pattern, a process for injecting impurity, and a process for removing the mask pattern are all needless. Therefore the manufacturing process of semiconductor device is simplified.

What is claimed is:

1. A method for forming channel stop diffusion layers when a plurality of high voltage element sections and low voltage element sections with lower withstand voltage than said high voltage element sections are formed on the same semiconductor substrate, comprising four steps of:

forming element separating areas on said semiconductor substrate for separating elements;

forming a mask pattern having openings above at least partially said low voltage element sections and openings above said element separating areas in said high voltage element sections on said semiconductor substrate;

injecting impurity of the first conducting type into said semiconductor substrate from above said mask pattern; and forming channel stop diffusion layers by diffusing said impurity of the first conducting type in said semiconductor substrate.

2. A method for forming channel stop diffusion layers as claimed in claim 1, wherein the opening width of the openings above said element separating areas is designed narrower than that of the element separating width of said element separating areas, and both ends of which opening are provided inside the both ends of said element separating area.

3. A method for forming channel stop diffusion layers as claimed in claim 1, wherein said element separating areas are formed with LOCOS.

4. A method for forming channel stop diffusion layers as claimed in claim 1, wherein said element separating areas are formed with trench elements.

5. A method for manufacturing MOS transistor IC in which high voltage MOS transistor elements and low voltage MOS transistor elements with lower withstand voltage than said high voltage MOS transistor elements are formed on the same semiconductor substrate, comprising seven steps of:

forming element separating areas on said semiconductor substrate for separating elements;

forming a mask pattern having openings above at least partially said low voltage element sections and openings above element separating areas in said high voltage element sections on said semiconductor substrate;

injecting impurity of the first conducting type into said semiconductor substrate from above said mask pattern;

injecting said impurity of the first conducting type only in said element separating areas of said semiconductor substrate from above said mask pattern;

forming channel stop diffusion layers by diffusing said impurity of the first conducting type;

forming gate oxide films; and forming gate electrodes.

6. A method for manufacturing MOS transistor IC as claimed in claim 5, wherein the opening width of the openings above said element separating areas is designed narrower than that of the element separating area width of said element separating areas, and both ends of which opening are provided inside the both ends of said element separating areas.

7. A method for manufacturing MOS transistor IC as claimed in claim 5, wherein said element separating areas are formed with LOCOS.

8. A method for manufacturing MOS transistor IC as claimed in claim 5, wherein said element separating areas are formed with trench elements.

* * * * *